(12) United States Patent
Kameda et al.

(10) Patent No.: US 8,581,639 B2
(45) Date of Patent: Nov. 12, 2013

(54) DIFFERENTIAL OUTPUT CIRCUIT

(75) Inventors: Satoshi Kameda, Kangawa-ken (JP); Takuma Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,514

(22) Filed: Sep. 7, 2012

(65) Prior Publication Data

US 2013/0162318 A1 Jun. 27, 2013

(30) Foreign Application Priority Data

Dec. 26, 2011 (JP) ................................ P2011-283952

(51) Int. Cl.
*H03B 1/00* (2006.01)

(52) U.S. Cl.
USPC .......................................... 327/108; 327/112

(58) Field of Classification Search
USPC ................................ 327/108, 112; 326/85, 87
See application file for complete search history.

(56) References Cited

U.S. PATENT DOCUMENTS

| 6,847,232 B2 | 1/2005 | Tinsley et al. | |
|---|---|---|---|
| 7,236,018 B1 * | 6/2007 | Wang et al. | 327/108 |
| 7,598,779 B1 | 10/2009 | Wang et al. | |
| 2005/0088431 A1 | 4/2005 | Liu et al. | |
| 2010/0079172 A1 | 4/2010 | Katoh et al. | |

FOREIGN PATENT DOCUMENTS

| JP | 2004-112453 | 4/2004 |
|---|---|---|
| JP | 2010-087545 | 4/2010 |

* cited by examiner

*Primary Examiner* — Hai L Nguyen
(74) *Attorney, Agent, or Firm* — Patterson & Sheridan, LLP

(57) ABSTRACT

A differential output circuit is controlled according to its mode of operation. While in the first mode, the differential output circuit controls a current flow through a variable current source according to an impedance of the variable current source, and while in the second mode, the differential output circuit compares a voltage at a monitored node and a reference voltage and controls the current flow through the variable current source to make the voltage at the monitored node to be equal to the reference voltage.

15 Claims, 3 Drawing Sheets

DIFFERENTIAL OUTPUT CIRCUIT

CROSS-REFERENCE TO RELATED APPLICATION

This application is based upon and claims the benefit of priority from Japanese Patent Application No. 2011-283952, filed Dec. 26, 2011; the entire contents of which are incorporated herein by reference.

FIELD

Embodiments described herein relate to a differential output circuit.

BACKGROUND

Generally, the maximum transmission speed when communicating using LVDS (Low Voltage Differential Signaling) methods is approximately 2 Gbps. If a higher transmission speed is needed, it is difficult for the LVDS method to meet such a requirement, and the LVDS method needs to be replaced with another method that provides a higher maximum transmission speed. One such possible method is CML (Current Mode Logic). However, even though the maximum data transmission speed in LVDS is lower, it has merit in that it consumes less electricity.

Based on this background, there is not yet a product that provides the merits of both LVDS and CML methods . For instance, if electric current consumption can be high for low-speed transmission, then the CML method is an acceptable option. Or if low electric current consumption without high transmission speeds is acceptable, the LVDS method is an option. But low electric current consumption with high transmission speeds is not available with using these methods individually unless they are combined. Combining circuits incorporating both methods will generally require increasing the required device circuit area, which may not be acceptable for many applications.

DETAILED DESCRIPTION

Figure 1:
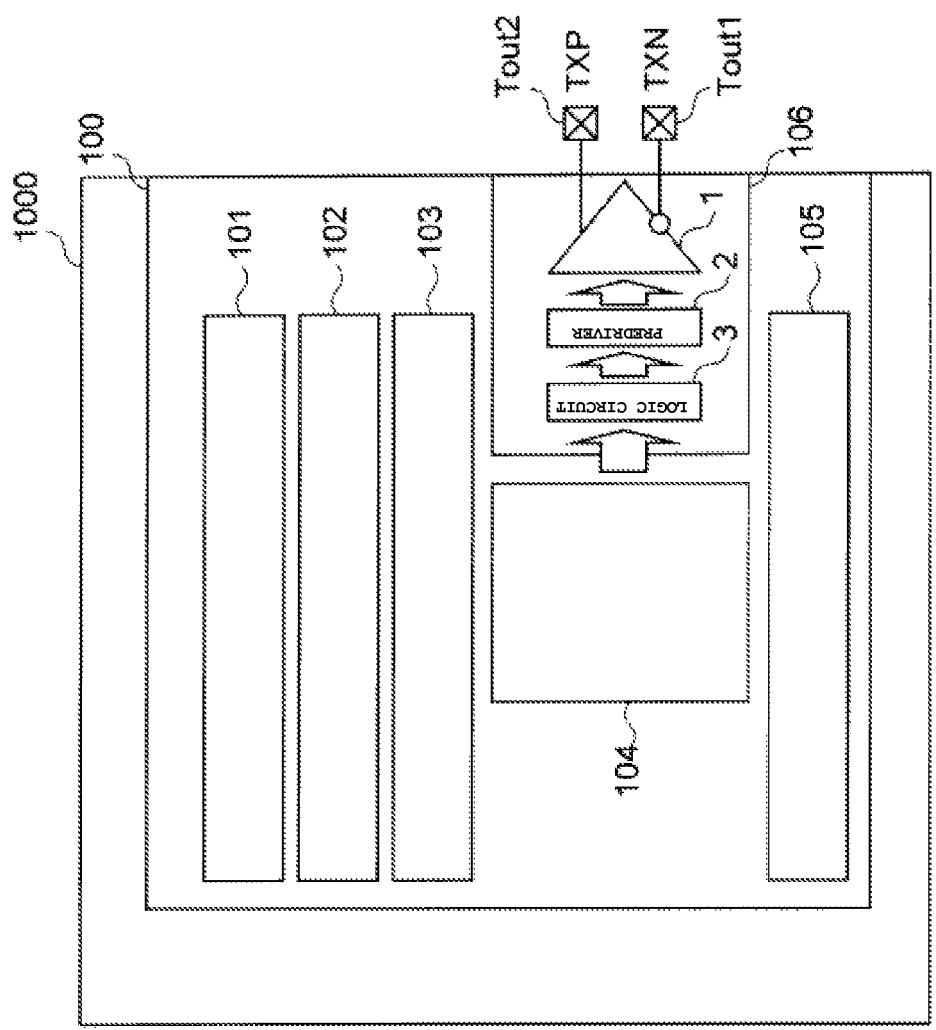
FIG. 1 shows one example of a semiconductor device structure incorporating a differential output circuit according to a first embodiment.

Embodiments describe methods for providing low current consumption and high transmission speeds without significant increases in device circuit area.

In general, in the embodiments described herein, a first potential line is connected with an electrical source, and a second potential line is connected with the ground; and a first conductivity type MOS transistor is a pMOS transistor, and a second conductivity type MOS transistor is an nMOS transistor.

According to one embodiment., there is provided a differential output circuit configured to operate in the LVDS mode (second mode) or the CML mode (first mode) without requiring an enlargement of the circuit size.

The differential output circuit according to an embodiment includes first, second, third, and fourth data terminals to which first, second, third, and fourth data signals are input, respectively. The third and fourth data signals are logically inverted signals of the first and second data signals, respectively. The differential output circuit further includes a first variable current source having a first end that is connected to the first potential line, a first MOS transistor of a first conductivity type having a first end that is connected between a first output terminal and a second end of the first variable current source, a first resistor connected between the first output terminal and the second end of the first variable current source, a second MOS transistor of a second conductivity type having a first end that is connected to the first output terminal, a second variable current source having a first end that is connected to the second potential line and a second end that is connected to the second MOS transistor, a third MOS transistor of the first conductivity type connected between the first variable current source and a second output terminal, and a second resistor connected in series with the third MOS transistor between the first variable current source and the second output terminal.

The differential output circuit further includes a fourth MOS transistor of the second conductivity type having a first end that is connected to the second output terminal and a second end that is connected to the second variable current source, a third resistor that is connected between a monitor node and the first output terminal, and a first switch element that is connected in series with the third resistor between the monitor node and the first output terminal. A selection signal for the first switch element is input via a terminal when the second mode (LDVS mode) of operation has been selected. The differential output circuit further includes a fourth resistor that is connected between the second output terminal and the monitor node, and a second switch element that is connected in series with the fourth resistor between the monitor node and the second output terminal. A selection signal for the second switch element is input via the terminal when the first mode has been selected.

A current control circuit of the differential output circuit, when the differential output circuit is in the first mode, controls the current flow to be a certain fixed value according to the impedance of the first variable current source and, when the differential output circuit is in the second mode, compares the voltage at the monitor node and a reference voltage and controls the current flow so that the voltage at the monitor node and the reference voltage are equal.

Moreover, when the differential output circuit is in the first mode, the first and third MOS transistors are controlled to be on, and the second MOS transistor is controlled to be on or off according to the second data signal. Also, the fourth MOS transistor is controlled to be on or off according to the fourth data signal.

When the differential output circuit is in the second mode, the first MOS transistor is controlled to be on or off according to the first data signal, and the second MOS transistor is controlled to be on or off according to the second data signal. Also, the third MOS transistor is controlled to be on or off according to the third data signal, and the fourth MOS transistor is controlled to be on or off according to the fourth data signal.

In the case the differential output circuit is connected to potential lines with opposite polarity, such that the first potential line is connected to the ground, and the second potential line is connected to an electrical source, the first conductivity type MOS transistor is the nMOS transistor and the second conductivity type MOS transistor is the pMOS transistor.

(Embodiment 1)

FIG. 1 shows an example of a semiconductor device that incorporates a differential output circuit according to a first embodiment. In FIG. 1, a semiconductor device (e.g., a semiconductor chip) 1000 is configured with a data processing system 100 that includes processor 101, memory 102, peripheral circuit 103, IP core 104, I/O circuit 105 and transmitting circuit 106. The transmitting circuit 106 outputs a differential output signal at nodes TXP and TXN through first and second output terminals Tout1 and Tout2 after processing an output signal from the IP core 104. The transmitting circuit 106 is configured with differential output circuit 1, pre-driver 2 and logic circuit 3.

Logic circuit 3 outputs and performs logical operations on the output signal from IP core 104. Pre-driver 2 amplifies an output signal from the logic circuit 3. The output signal from the pre-driver 2, as explained later, contains selection signal Ss, reference voltage Vref, fixed voltage Vg, and the first through fourth data signals SD1, SD2, SD1B and SD2B. The differential output circuit 1 transmits a signal that has been derived from the output signal from the pre-driver 2 through Tout1 and Tout2 of the first and second output terminals using the CML or LVDS method.

Figure 2:
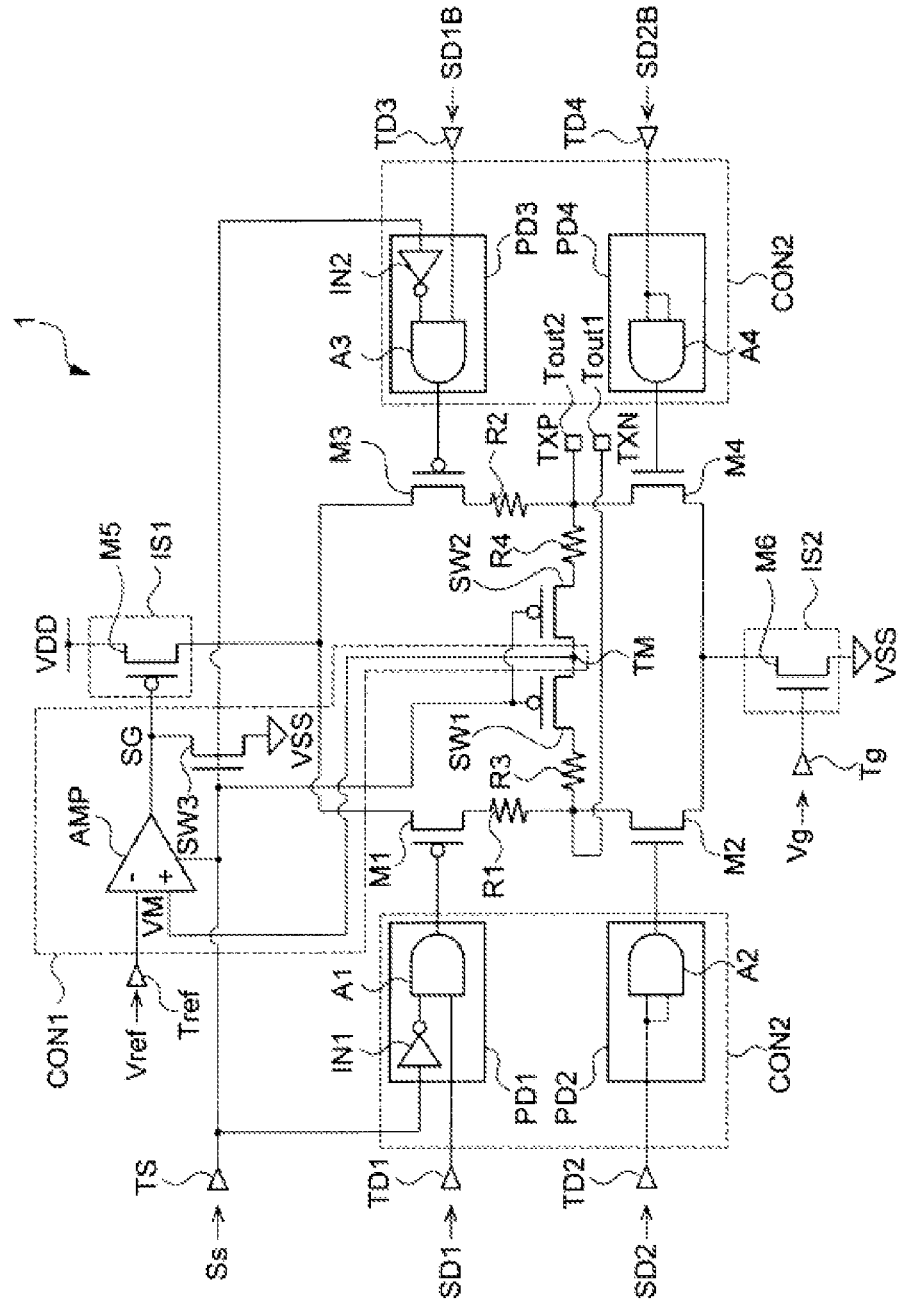
FIG. 2 shows an example of a circuit structure of the differential output circuit according to the first embodiment.

FIG. 2 shows an example of a circuit structure of a differential output circuit according to a first embodiment.

FIG. 2 shows a differential output circuit 1 including the following: selection signal TS, reference voltage terminal Tref, first data terminal TD1, second data terminal TD2, third data terminal TD3, fourth data terminal TD4, first variable current source IS1, second variable current source IS2, first MOS transistor of a first conductivity type (e.g., pMOS transistor) M1, second MOS transistor of a second conductivity type (e.g., nMOS transistor) M2, third MOS transistor of the first conductivity type (pMOS transistor) M3, fourth MOS transistor of the second conductivity type (nMOS transistor) M4, first resistor R1, second resistor R2, third resistor R3, fourth resistor R4, first switch element SW1, second switch element SW2, current control circuit CON1, and control circuit CON2 for the data signals.

The selection terminal TS is input with a selection signal Ss output from the pre-driver 2 when the data is transmitted. The reference voltage Vref is applied to the reference terminal Tref from the output of pre-driver 2 when the data is transmitted. During the transmission process, the first data terminal TD1 will receive an input of the first data signal SD1 from the output of the pre-driver 2; the second data terminal TD2 will receive an input of the second data signal SD2 from the output of the pre-driver 2; the third data terminal TD3 will receive an input of the third data signal SD1B, which is a signal that is logically inverted from the first data signal SD1, from the output of the pre-driver 2; and the fourth data terminal TD4 will receive an input of the fourth data signal SD2B, which is a signal that is logically inverted from the second data signal SD2, from the output of the pre-driver 2. When the data is being transmitted, the first data signal SD1, for example, is equivalent to SD2 of the second data signal. In the same concept, the third data signal SD1B is equivalent to the fourth data signal SD2B.

The first variable current source IS1 is connected to one end of the first potential line VDD. The first variable current source IS1, in this embodiment, includes the fifth MOS transistor (pMOS transistor) M5 of the first conductivity type. The fifth MOS transistor M5 has one end (source) connected to the first potential line VDD, the other end (drain) connected to one end (source) of the first MOS transistor M1, and a gate that is supplied with a control signal SG.

The first MOS transistor M1 has one end connected to the first variable current source IS1 and the other end connected to the first output terminal Tout1. The first resistor R1 is connected in series with the first MOS transistor M1 between the first variable current source IS1 and the first output terminal Tout1. When considering the parasitic capacitance of the first MOS transistor M1 with respect to the first output terminal Tout1, it can seen from FIG. 2 that one end of the first resistor R1 is connected to the first output terminal Tout1, the first MOS transistor M1 is connected to the first variable current source IS1 and the other end of the first resistor R1. The arrangement of the first MOS transistor M1 and resistor R1 depicted in FIG. 2 facilitates the circuit design.

Also, the second MOS transistor M2 has one end (drain) connected to the first output terminal Tout1. The second variable current source IS2 has one end connected to the other end of the second MOS transistor M2 (source), and the other end connected to the second potential line VSS. The second variable current source IS2, in this embodiment, is the sixth MOS transistor (nMOS transistor) M6 of the second conductivity type. The sixth MOS transistor M6 has one end (drain) connected to the other end of the second MOS transistor M2 (source), the other end (source) connected to the second potential line VSS, and gate to which a fixed voltage Vg is applied (via gate terminal Tg).

Also, the third MOS transistor M3 has one end connected to the first variable current source IS1 and the other end connected to the second output terminal Tout2. The second resistor R2 is connected in the series with the third MOS transistor M3 between the first variable current source IS1 and the second output terminal Tout2. When considering the parasitic capacitance of the second MOS transistor M2 with respect to the second output terminal Tout2, it can seen from FIG. 2 that one end of the second resistor R2 is connected to the second output terminal Tout2, the third MOS transistor M3 is connected to the first variable current source IS1 and the other end of the second resistor R2.

The fourth MOS transistor M4 has one end (drain) that is connected to the second output terminal Tout2 and the other end (source) connected to the second variable current source IS2.

The third transistor R3 is connected between the first output terminal Tout1 and the monitor node TM. The first switch element SW1 is connected in series with the third resistor R3 between the first output terminal Tout 1 and the monitor node TM. The first switch element SW1, in this embodiment, is a first conductivity type MOS transistor (pMOS transistor). This first switch SW1 is off in the first mode according to the selection of CML method for the selection signal Ss (CML mode) (e.g., when the selection signal Ss is at a "high" level); and it is on in the second mode according to the selection of the LVDS method for the selection signal Ss (LVDS mode) (e.g., selection signal Ss is at a "low" level). When considering the parasitic capacitance of the first switch element (pMOS transistor) SW1 with respect to the first output terminal Tout1, it can be seen from FIG. 2 that one end of the third resistor R3 is connected to the first output terminal Tout1, the first switch element SW1 is connected to the other end of the third resistor R3 and the monitor node TM.

The fourth resistor R4 is connected between the second output terminal Tout2 and the monitor node TM. The second switch element SW2 is connected in series with the fourth resistor R4 between the second output terminal Tout2 and the monitor node TM, and in this embodiment, is a first conductivity type MOS transistor (pMOS transistor). The second switch element SW2, is off in the first mode (CML mode) and on in the second mode (LVDS mode). When considering the parasitic capacitance of the second switch element (pMOS transistor) SW2 with respect to the second output terminal Tout2, it can be seen from FIG. 2 that one end of the fourth resistor R4 is connected to the second output terminal Tout2, the second switch element SW2 is connected to the other end of the fourth resistor R4 and the monitor node TM.

The current control circuit CON1, when the differential output circuit 1 is in the first mode (CML mode), controls the current output by the first variable current source IS1 to be a predetermined current corresponding to the impedance of the first variable current source IS1 or a set value (low impedance) (the "on" condition of the fifth MOS transistor M5). On the other hand, the current control circuit CON1, when the differential output circuit 1 is in the second mode (LVDS mode), controls the current output by the first variable current source IS1 according to the reference voltage Vref compared to the monitor voltage VM of the monitor node TM.

The current control circuit CON1 includes, in one embodiment, an amplifier circuit (common mode feedback amp) AMP and the third switch element SW3, as shown in FIG. 2. The amplifier circuit AMP produces the control signal SG of the fifth MOS transistor M5, when it determines from comparing the monitor voltage VM and the reference voltage Vref that the monitor voltage VM is equal to the reference voltage Vref. When the monitor voltage VM is higher than the reference voltage Vref, the amplifier circuit AMP restricts the transmitted current from the fifth MOS transistor M5. When the monitor voltage VM is lower than the reference voltage Vref, the amplifier circuit AMP increases the transmitted current from the fifth MOS transistor M5.

The third switch element SW3 is connected between the gate of the fifth MOS transistor M5 and the second potential line VSS, and is switched on or off according to the selection signal Ss. This third switch element SW3, in this embodiment, is an nMOS transistor having a gate to which the selection signal Ss is input. For example, the third switch element SW3, is on in the first mode (CML mode) (e.g., when the selection signal Ss is at a high level), and is off in the second mode (LVDS mode) (e.g., when the selection signal Ss is at a low level).

When the data signal control circuit CON2 is in the first mode (CML mode), the first and third MOS transistors M1 and M3 are turned on; the second MOS transistor M2 will be turned on or off according to the second data signal SD2; and the fourth MOS transistor M4 will be turned on or off according to the fourth data signal SD2B.

When the data signal control circuit CON2 is in the second mode (LVDS mode), the first MOS transistor M1 will be turned on or off according to the first data signal SD1; the second MOS transistor M2 will be turned on or off according to the second data signal SD2; the third MOS transistor M3 will be turned on or off according to the third data signal SD1B; and the fourth MOS transistor M4 will be turned on or off according to the fourth data signal SD2B.

The data signal control circuit CON2, in one embodiment, includes first pre-driver PD1, second pre-driver PD2, third pre-driver PD3 and fourth pre-driver PD4.

The first pre-driver PD1 controls the gate voltage of the first MOS transistor M1 based on the selection signal Ss and the first data signal SD1. The first pre-driver PD1, as shown in FIG. 2, has a first inverter IN1 that is connected to the selection terminal Ts, and a first AND circuit A1 to which the output of the first data terminal TD1 and the output of the first inverter IN1 are input.

The second pre-driver PD2, controls the gate voltage of the second MOS transistor M2 based on the second data signal SD2. The second pre-driver PD2, as shown in FIG. 2, is connected to the second data terminal TD2, and includes a second AND circuit A2, the output of which is connected to the second MOS transistor M2 gate.

The third pre-driver PD3 controls the gate voltage of the third MOS transistor M3 in response to the selection signal Ss and the third data signal SD1B. The third pre-driver PD3, as shown in FIG. 2, includes a second inverter IN2 to which the output of the selection terminal Ts is input, and a third AND circuit A3 to which the outputs of the third data terminal TD3 and the second inverter are input and an output of which is input to the gate of the third MOS transistor M3.

The fourth pre-driver PD4 controls the gate voltage of the fourth MOS transistor M4 in response to the fourth data signal SD2B. The fourth pre-driver PD4, as shown in FIG. 2, is connected to the fourth data terminal TD4, and includes a fourth AND circuit A4, the output of which is connected to the gate of the fourth MOS transistor M4.

The following will describe an example operation of the differential output circuit 1 composed of these components.

Generally during the transmission process, it is unlikely that there will be a sudden switch of the transmission method between LVDS and CML. Typically, the transmission method is determined by the receiver. The differential output circuit 1 allows changes between the LVDS and CML methods in response to the selection signal Ss.

First, when the selection signal Ss chooses the CML method then the first mode will be regulated (CML mode) (Ss is at a high level). In the first mode (CML mode), the third switch element SW3 will be on. Based on the selection signal Ss, the amplifier circuit AMP output will be invalid, and at the same time according to the third switch element SW3, the gate voltage of the fifth MOS transistor M5 will be turned to "low" level, and the fifth MOS transistor M5 is fully turned on. In other words, the current control circuit CON1 controls so that a predetermined current flows by setting the impedance of the first variable current source IS1 at a low impedance value (that is, the fifth MOS transistor M5 is turned on).

Furthermore, in the first mode (CML mode), the first and second switch elements SW1 and SW2 are off. Based on this, the third and fourth resistor R3 and R4 will not transmit any current, and the pathway between the first and second output terminal Tout1 and Tout2 will be open.

Furthermore, in the first mode (CML mode) the data signal control circuit CON2, will apply to the "low" level signal to the gates of the first and third MOS transistor M1 and M3. Also, the second and fourth data signal SD2 and SD2B are applied to the gates of the second and fourth MOS transistor M2 and M4. In other words, in the case of the first mode (CML mode), the data signal control circuit CON2 will turn on the first and third MOS transistor M1 and M3, control the on/off of the second MOS transistor M2 according to the second data signal SD2, and control the on/off of the fourth MOS transistor M4 according to the fourth data signal SD2B.

Similarly, the first, third and fifth MOS transistors M1, M3 and M5 will be fully on, that is, in a situation where the on resistance is low, to allow the first and second resistors R1 and R2 to function. As a result, the differential output circuit 1 enables the CML method.

At this time, the pull-up resistant value related to the first output terminal Tout1 is the total of the on resistance of the fifth MOS transistor M5, the on resistance of the first MOS transistor M1, and the resistance value of the first resistor R1. Also, the pull-up resistant value related to the second output terminal Tout2 is the total of the on resistance of the fifth MOS transistor M5, the on resistance of the third MOS transistor M3, and the resistance value of the second resistor R2. The amplitude of the output signal when the first mode is in action (CML mode) is determined by the total of the pull-up resistant values, and the drain-to-source current passing through the sixth MOS transistor M6. The output current of the sixth MOS transistor M6 is controlled based on the fixed voltage Vg.

The following will explain the situation when the second mode (LVDS mode) has been chosen by the selection signal Ss (the selection signal Ss is at the low level).

The third switch element SW3 is off during the second mode (LVDS mode). Based on the selection signal Ss, the amplifier circuit AMP output will be valid. The amplifier circuit AMP outputs the control signal SG to the gate of the fifth MOS transistor M5, upon comparing the monitor voltage VM and the reference voltage Vref and determining that the monitor voltage VM is equal to the reference voltage Vref. When the monitor voltage VM is higher than the reference voltage Vref, the amplifier circuit AMP restricts the transmitted current from the fifth MOS transistor M5, and when the monitor voltage VM is lower than the reference voltage Vref, the amplifier circuit AMP increases the transmitted current from the fifth MOS transistor M5. In this manner, the current control circuit CON1 in the second mode (LVDS mode) controls the current passing through the first variable current source IS1 in order to make the monitor voltage VM and the reference voltage Vref the same.

Furthermore, the first and second switch elements SW1 and SW2 are on in the second mode (LVDS mode). The monitor voltage (common mode voltage) VM is returned to the input of the amplifier circuit AMP. The monitor voltage VM is generated based on the differential output signal at nodes TXN and TXP received via the third resistor R3 and the fourth resistor R4, respectively, during operation.

Furthermore, in the data signal control circuit CON2 in the second mode (LVDS mode), the first MOS transistor M1 will be turned on or off according to the first data signal SD1, the second MOS transistor M2 will be turned on or off according to the second data signal SD2; similarly the third MOS transistor M3 will be turned on or off according to the third data signal SD1B; and finally the fourth MOS transistor M4 will be turned on or off according to the fourth data signal SD2B. As a result, the differential output circuit 1 enables the LVDS method.

Accordingly, the differential output circuit 1 can be used in a wide range of areas from low to high transmission speeds. Also, the differential output circuit 1 in order to become a unified circuit device for both methods, can allow the increase of the integrated circuit size to be limited. In other words, the differential output circuit 1 restrains the increase of the size of the integrated circuit, and allows the suitability to use either the LVDS or CML method.

(Embodiment 2)

The second embodiment explains the other configuration examples of the differential output circuit. The second embodiment can be applied in the semiconductor device in FIG. 1.

Figure 3:
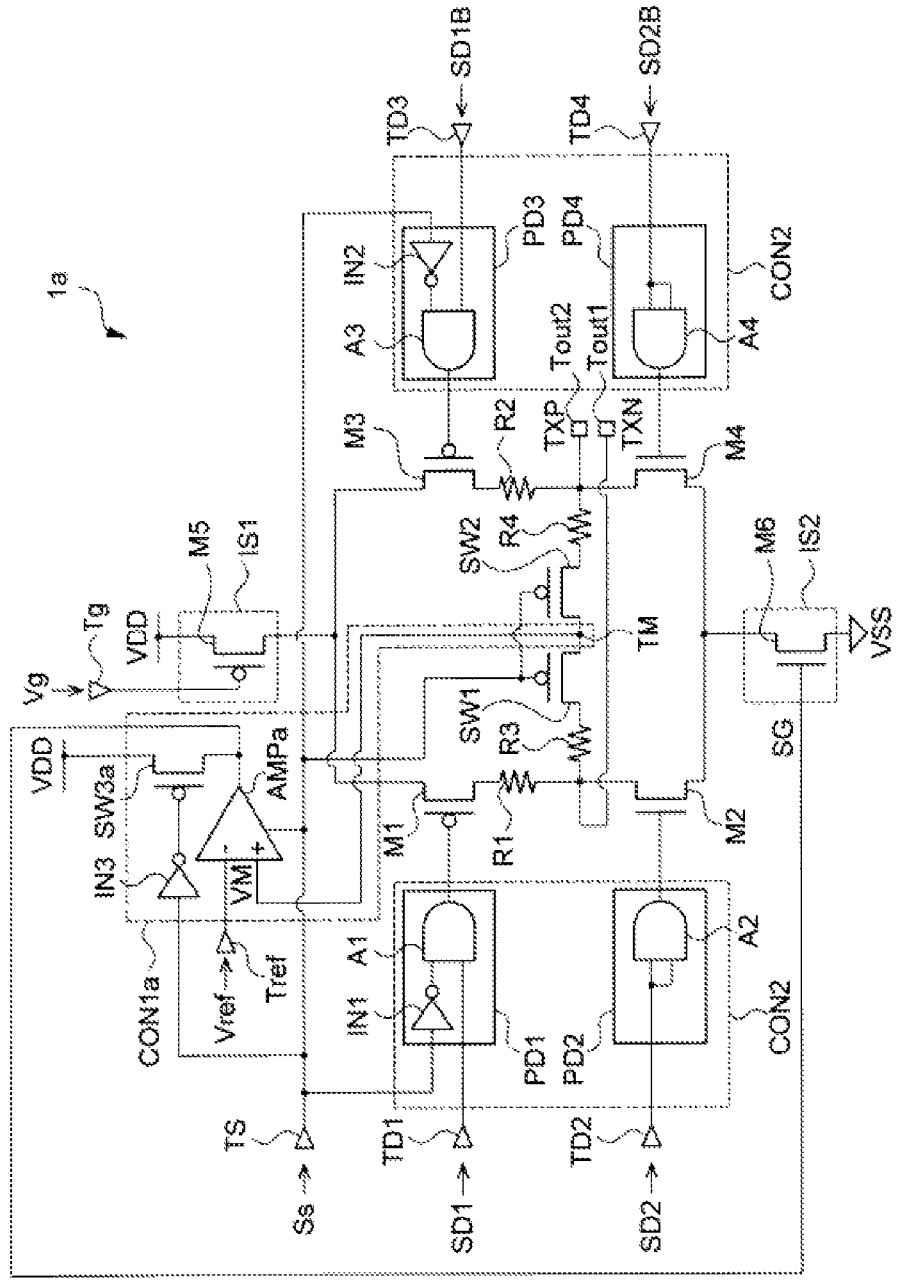
FIG. 3 shows an example of a circuit structure of a differential output circuit according to a second embodiment.

FIG. 3 shows an example of a circuit structure of a differential output circuit according to a second embodiment. The symbols used in FIG. 3 that are the same as the ones used in FIG. 2 refer to elements that are common between the figures.

FIG. 3 shows a differential output circuit 1a that includes the following: a selection terminal TS, a reference voltage terminal Tref, a first data terminal TD1, a second data terminal TD2, a third data terminal TD3, a fourth data terminal TD4, a first variable current source IS1, a second variable current source IS2, a first MOS transistor of the first conductivity type (pMOS transistor) M1, a second MOS transistor of the second conductivity type (nMOS transistor) M2, a third MOS transistor of the first conductivity type (pMOS transistor) M3, a fourth MOS transistor of the second conductivity type (nMOS transistor) M4, a first resistor R1, a second resistor R2, third resistor R3, a fourth resistor R4, a first switch element SW1, a second switch element SW2, a current control circuit CON1a and control circuit of data signal CON2.

Here, different from the first embodiment, the fifth MOS transistor M5 which is the first variable current source IS1 has a fixed voltage Vg applied to its gate (gate terminal Tg). Also, at the sixth MOS transistor M6, which is the second variable current source IS2, the control signal SG is input to its gate. Also, the current control circuit CON1a, in the first mode (CML mode), is controlled according to a set current impedance at the second variable current source IS2 or a set value (low impedance) (the "on" condition of the sixth MOS transistor M6). Alternately, in the second mode (LVDS mode), the current control circuit CON1a is configured to control by restraining the transmitted current through the second variable current source IS2, to make sure that the monitor voltage VM of the monitor node TM and the reference voltage Vref are the same.

The current control circuit CON1a includes a third inverter IN3, and an amplifier AMPa and a third switch element SW3a. The third inverter IN3 is connected to the selection terminal TS. The third switch element SW3a is connected between the gate of the sixth MOS transistor and the first potential line VDD, and has a gate to which the output of the third inverter IN3 is connected. The third switch element SW3 is on in the first mode (CML mode) and, off in the second mode (LVDS mode).

The amplifier circuit AMPa in the second mode (CML mode) outputs the control signal SG to the gate of the sixth MOS transistor M6 based on a comparison of the monitor voltage VM and the reference voltage Vref, to make the monitor voltage VM and the reference voltage Vref the same value.

The differential output circuit 1a is different from the first embodiment in that the current control circuit CON1a controls the second variable current source IS2. Yet, the differential output circuit 1a has the same structure in other components and functions with the first embodiment of the differential output circuit 1. In other words, the differential output circuit 1a is the same as the first embodiment that it can be used in a wide range of applications from low to high speeds. Also, the differential output circuit 1 can limit the increase of the integrated circuit size so that a unified circuit that can perform both methods can be implemented. Accordingly, as in the first embodiment, the second embodiment of the differential output circuit can restrain the increase of the circuit size in order to be suitable for both LVDS and CML methods.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A differential output circuit comprising:
   a first variable current source having a first end that is connected to a first potential line;

a first MOS transistor of a first conductivity type having a first end that is connected to a second end of the first variable current source and a second end connected to a first output terminal;
a first resistor that is connected in series with the first MOS transistor between the first variable current source and the first output terminal;
a second MOS transistor of a second conductivity type having a first end that is connected to the first output terminal;
a second variable current source having a first end that is connected to a second end of the second MOS transistor and a second end to a second potential line;
a third MOS transistor of the first conductivity type having a first end that is connected to the second end of the first variable current source and a second end connected to a second output terminal;
a second resistor that is connected in series with the third MOS transistor between the first variable current source and the second output terminal;
a fourth MOS transistor of the second conductivity type, having a first end that is connected to the second output terminal and a second end that is connected to the second end of the second variable current source;
a third resistor that is connected to the first output terminal and a monitor node;
a first switch element that is turned off in a first mode turned on in a second mode, and connected in series with the third resistor between the first output terminal and the monitor node;
a fourth resistor that is connected between the second output terminal and the monitor node;
a second switch element that is turned off in the first mode, turned on in the second mode, and connected in series with the fourth resistor between the second output terminal and the monitor node;
a current control circuit for controlling a current output by the first variable current source according to an impedance of first variable current source in the first mode, and according to difference in a voltage at the monitor node and a reference voltage in the second mode; and
a data signal control circuit for controlling the first through fourth transistors based on whether a mode of operation is the first mode or the second mode.

2. The differential output circuit according to claim 1, wherein, in the first mode, the data signal control circuit turns on the first and third MOS transistors, turns on or off the second MOS transistor according to a second data signal, turns on or off the fourth MOS transistor according to a fourth data signal, and in the second mode, turns on or off the first MOS transistor according to a first data signal, turns on or off the second MOS transistor according to the second data signal, turns on or off the third MOS transistor according to a third data signal, and turns on or off the fourth MOS transistor according to the fourth data signal.

3. The differential output circuit according to claim 2, wherein the third signal is a logical inverse of the first signal, and the fourth signal is a logical inverse of the second signal.

4. The differential output circuit according to claim 1, wherein
the first variable current source is a fifth MOS transistor of the first conductivity type having a first end connected to the first potential line and a second end connected to the first end of the first MOS transistor; and
the current control circuit compares the voltage at the monitor node with the reference voltage and, if they are not the same, outputs a control signal to a gate of the fifth MOS transistor.

5. The differential output circuit according to claim 4, further comprising a third switch element connected between the gate of the fifth MOS transistor and the second potential line, the third switch element being switched on in the first mode, and turned off in the second mode.

6. The differential output circuit according to claim 1, wherein the second variable current source includes a sixth MOS transistor of the second conductivity type having a first end connected to the second end of the second MOS transistor and a second end connected to the second potential line.

7. The differential output circuit according to claim 1, wherein a CML method is regulated in the first mode and an LVDS method is regulated in the second mode.

8. A method of operating a differential output circuit in one of a first mode and a second mode, the differential output circuit comprising:
a first variable current source having a first end that is connected to a first potential line;
a first MOS transistor of a first conductivity type having a first end that is connected to a second end of the first variable current source and a second end connected to a first output terminal;
a first resistor that is connected in series with the first MOS transistor between the first variable current source and the first output terminal;
a second MOS transistor of a second conductivity type having a first end that is connected to the first output terminal;
a second variable current source having a first end that is connected to a second end of the second MOS transistor and a second end to a second potential line;
a third MOS transistor of the first conductivity type having a first end that is connected to the second end of the first variable current source and a second end connected to a second output terminal;
a second resistor that is connected in series with the third MOS transistor between the first variable current source and the second output terminal;
a fourth MOS transistor of the second conductivity type, having a first end that is connected to the second output terminal and a second end that is connected to the second end of the second variable current source;
a third resistor that is connected to the first output terminal and a monitor node;
a first switch element that is turned off in the first mode turned on in the second mode, and connected in series with the third resistor between the first output terminal and the monitor node;
a fourth resistor that is connected between the second output terminal and the monitor node; and
a second switch element that is turned off in the first mode, turned on in the second mode, and connected in series with the fourth resistor between the second output terminal and the monitor node,
said method comprising the steps of:
receiving a selection of one of the first mode and the second mode; and
controlling a current output by the first variable current source according to an impedance of first variable current source if the selected mode is the first mode and according to a difference in a voltage at the monitor node and a reference voltage if the selected mode is the second mode.

9. The method according to claim 8, further comprising:
wherein, when the selected mode is the second mode, controlling the current output by the first variable current source to be a predetermined current corresponding to an impedance of the first variable current source.

10. The method according to claim 8, further comprising:
when the selected mode is the second mode, restricting the current output by the first variable current source if the voltage at the monitor node is higher than the reference voltage, and increasing the current output by the first variable current source if the voltage at the monitor node is lower than the reference voltage.

11. The method according to claim 8, further comprising controlling the first through fourth transistors differently according to the selected mode.

12. The method according to claim 11, wherein, in the first mode, the first and third MOS transistors are turned on, the second MOS transistor is turned on or off according to a second data signal, the fourth MOS transistor is turned on or off according to a fourth data signal, and in the second mode, the first MOS transistor is turned on or off according to a first data signal, the second MOS transistor is turned on or off according to the second data signal, the third MOS transistor is turned on or off according to a third data signal, and the fourth MOS transistor is turned on or off according to the fourth data signal.

13. The method according to claim 12, wherein the third signal is a logical inverse of the first signal, and the fourth signal is a logical inverse of the second signal.

14. The method according to claim 8, wherein the differential output circuit further comprises a third switch element connected between the gate of the fifth MOS transistor and the first potential line, the third switch element being switched on in the first mode and turned off in the second mode.

15. The method according to claim 8, wherein a CML method is regulated in the first mode, and an LVDS method is regulated in the second mode.

* * * * *